(12) United States Patent
Park et al.

(10) Patent No.: US 11,894,500 B2
(45) Date of Patent: Feb. 6, 2024

(54) LIGHTING DEVICE

(71) Applicant: LG INNOTEK CO., LTD., Seoul (KR)

(72) Inventors: Hoon Park, Seoul (KR); Sarum Han, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/952,622

(22) Filed: Sep. 26, 2022

(65) Prior Publication Data

US 2023/0013315 A1    Jan. 19, 2023

Related U.S. Application Data

(63) Continuation of application No. 17/276,223, filed as application No. PCT/KR2019/012714 on Sep. 30, 2019, now Pat. No. 11,489,096.

(30) Foreign Application Priority Data

Oct. 1, 2018    (KR) ........................ 10-2018-0116802

(51) Int. Cl.
| | | |
|---|---|---|
| *H01L 33/58* | (2010.01) | |
| *G02B 5/02* | (2006.01) | |
| *H01L 33/24* | (2010.01) | |
| *H01L 25/075* | (2006.01) | |

(52) U.S. Cl.
CPC ............ *H01L 33/58* (2013.01); *G02B 5/0263* (2013.01); *H01L 25/0753* (2013.01); *H01L 33/24* (2013.01)

(58) Field of Classification Search
None
See application file for complete search history.

(56) References Cited

U.S. PATENT DOCUMENTS

| | | |
|---|---|---|
| 7,630,025 B2 | 12/2009 | Park et al. |
| 8,624,272 B2 | 1/2014 | Takashima et al. |
| 9,312,458 B2 | 4/2016 | Park et al. |

(Continued)

FOREIGN PATENT DOCUMENTS

| | | |
|---|---|---|
| CN | 101384929 | 3/2009 |
| CN | 102042565 | 5/2011 |

(Continued)

OTHER PUBLICATIONS

International Search Report dated Jan. 16, 2020 issued in Application No. PCT/KR2019/012714.

(Continued)

*Primary Examiner* — Ashok Patel
(74) *Attorney, Agent, or Firm* — KED & ASSOCIATES, LLP (57) ABSTRACT

A lighting device disclosed in an embodiment of the invention includes a substrate; a plurality of light sources spaced apart from each other at predetermined intervals on the substrate; a resin layer disposed on the substrate; a phosphor layer disposed on the resin layer and having a pattern layer including a concave portion and a convex portion formed on a surface facing the resin layer; and a diffusion layer disposed between the resin layer and the phosphor layer, wherein a thickness of the diffusion layer may be 10% or more and less than 50% of the maximum thickness of the phosphor layer.

10 Claims, 8 Drawing Sheets

(56) References Cited

U.S. PATENT DOCUMENTS

| | | | |
|---|---|---|---|
| 2012/0182714 A1 | 7/2012 | Kwon et al. | |
| 2013/0154474 A1 | 6/2013 | Takeda et al. | |
| 2014/0168988 A1 | 6/2014 | Petersen et al. | |
| 2022/0342142 A1* | 10/2022 | Choi | F21V 7/0016 |

FOREIGN PATENT DOCUMENTS

| | | |
|---|---|---|
| CN | 103486460 | 1/2014 |
| CN | 103918348 | 7/2014 |
| CN | 103244872 | 7/2015 |
| JP | 2009-123675 | 6/2009 |
| JP | 2011-022265 | 2/2011 |
| JP | 2017-191875 | 10/2017 |
| KR | 10-2011-0034072 | 4/2011 |
| KR | 10-2012-0026343 | 3/2012 |
| KR | 10-2015-0058821 | 5/2015 |
| KR | 10-2017-0052208 | 12/2017 |

OTHER PUBLICATIONS

European Search Report dated Oct. 20, 2021 issued in EP Application No. 19869396.2.
U.S. Office Action dated Mar. 10, 2022 issued in U.S. Appl. No. 17/276,223.

* cited by examiner

LIGHTING DEVICE

CROSS-REFERENCE TO RELATED APPLICATIONS

This application is a Continuation Application of U.S. patent application Ser. No. 17/276,223 filed Mar. 15, 2021 (now U.S. Pat. No. 11,489,096), which is a U.S. National Stage Application under 35 U.S.C. § 371 of PCT Application No. PCT/KR2019/012714, filed Sep. 30, 2019, which claims priority to Korean Patent Application No. 10-2018-0116802, filed Oct. 1, 2018, whose entire disclosures are hereby incorporated by reference.

BACKGROUND

1. Field

The embodiment relates to a surface-emitting lighting device for improving light efficiency.

2. Background

Typical light emitting devices, for example, light emitting diodes (LEDs) have advantages such as low power consumption, semi-permanent life, fast response speed, safety, and environmental friendliness compared to conventional light sources such as fluorescent lamps and incandescent lamps. These light emitting diodes are applied to various display devices, various lighting devices such as indoor or outdoor lights. Recently, as a vehicle light source, a lamp employing a light emitting diode has been proposed. Compared with incandescent lamps, light emitting diodes are advantageous in that power consumption is small. Since a size of the light emitting device is small, it may increase the design freedom of the lamp, and it is economical due to its semi-permanent life. Such a vehicle lighting device uses a surface light source lighting device, thereby creating a three-dimensional effect and a unique aesthetic sense of a vehicle lamp. Conventional vehicle lighting devices implement a shape of a specific pattern by forming a pattern on a surface of a phosphor layer or using different phosphors to form a specific pattern. The phosphor layer needs to maintain a certain thickness to effectively express a specific color. However, when a concave pattern is formed on the surface of the phosphor layer, the thickness of a portion of the phosphor layer decreases, thereby preventing light diffusion. On the other hand, when a protruding pattern is formed on the surface of the phosphor layer, the thickness of a portion of the phosphor layer increases, resulting in a problem in that light efficiency is deteriorated.

BRIEF DESCRIPTION OF THE DRAWINGS

The embodiments will be described in detail with reference to the following drawings in which like reference numerals refer to like elements wherein:

FIGS. 8 and 9 are diagrams showing a state in which an image is turned on.

DETAILED DESCRIPTION

Hereinafter, preferred embodiments of the invention will be described in detail with reference to the accompanying drawings. However, the technical spirit of the invention is not limited to some embodiments to be described, and may be implemented in various other forms, and one or more of the components may be selectively combined and substituted for use within the scope of the technical spirit of the invention. In addition, the terms (including technical and scientific terms) used in the embodiments of the invention, unless specifically defined and described explicitly, may be interpreted in a meaning that may be generally understood by those having ordinary skill in the art to which the invention pertains, and terms that are commonly used such as terms defined in a dictionary should be able to interpret their meanings in consideration of the contextual meaning of the relevant technology.

Further, the terms used in the embodiments of the invention are for explaining the embodiments and are not intended to limit the invention. In this specification, the singular forms also may include plural forms unless otherwise specifically stated in a phrase, and in the case in which at least one (or one or more) of A and (and) B, C is stated, it may include one or more of all combinations that may be combined with A, B, and C. In describing the components of the embodiments of the invention, terms such as first, second, A, B, (a), and (b) may be used. Such terms are only for distinguishing the component from other component, and may not be determined by the term by the nature, sequence or procedure etc. of the corresponding constituent element. And when it is described that a component is "connected", "coupled" or "joined" to another component, the description may include not only being directly connected, coupled or joined to the other component but also being "connected", "coupled" or "joined" by another component between the component and the other component. In addition, in the case of being described as being formed or disposed "above (on)" or "below (under)" of each component, the description includes not only when two components are in direct contact with each other, but also when one or more other components are formed or disposed between the two components. In addition, when expressed as "above (on)" or "below (under)", it may refer to a downward direction as well as an upward direction with respect to one element.

Figure 1:
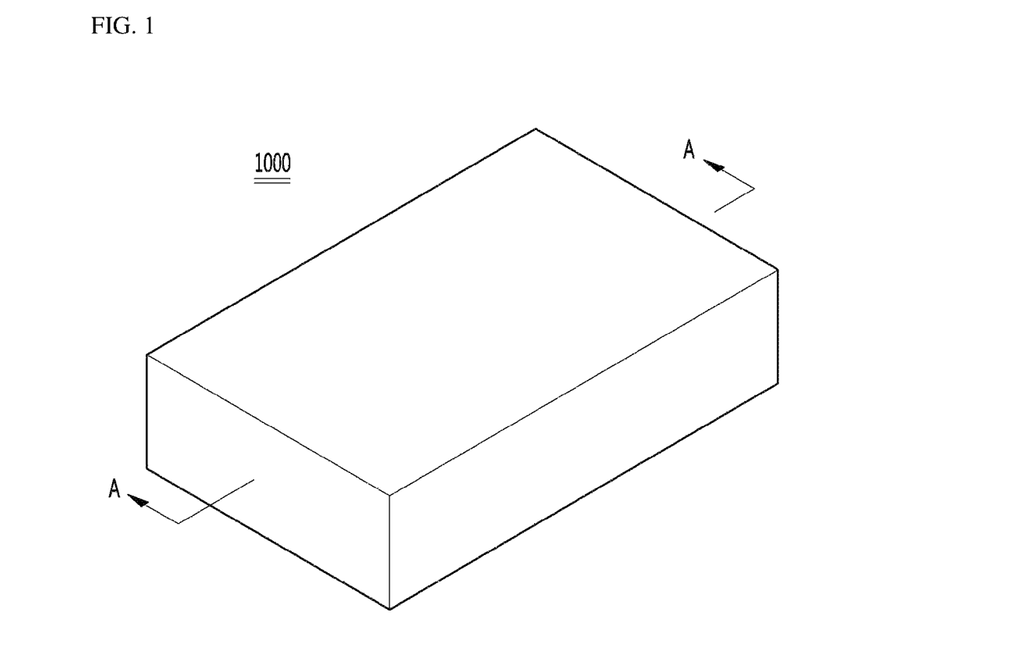
FIG. 1 is a schematic perspective view showing a lighting device according to a first embodiment.
Figure 2:
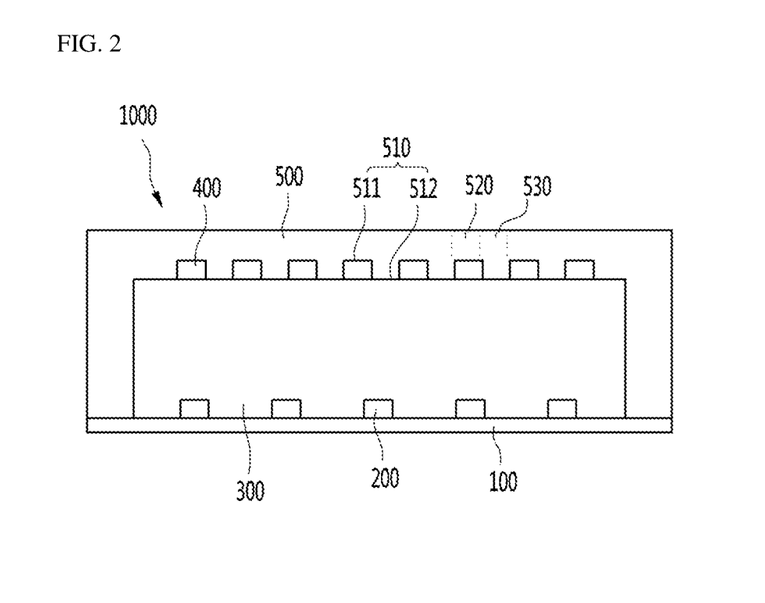
FIG. 2 is an A-A cross-section view of FIG. 1.
Figure 3:
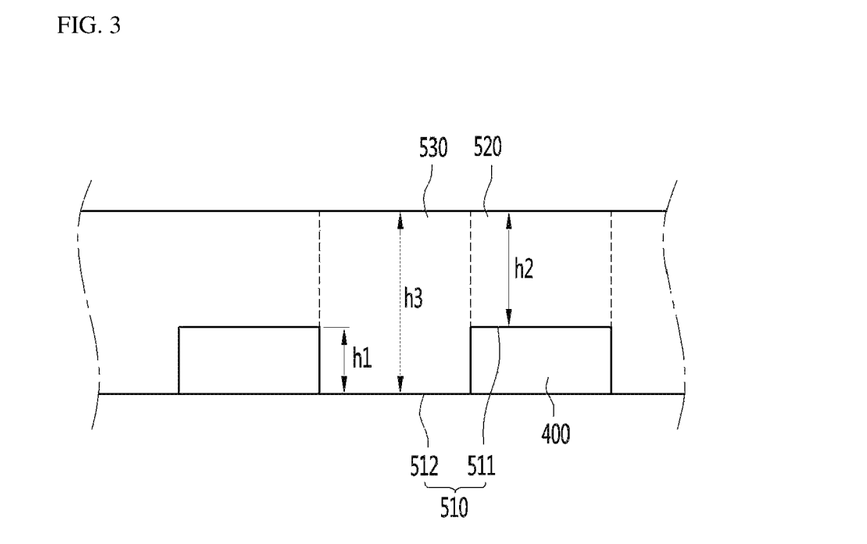
FIG. 3 is an enlarged view showing a partial region of FIG. 2.
Figure 4:
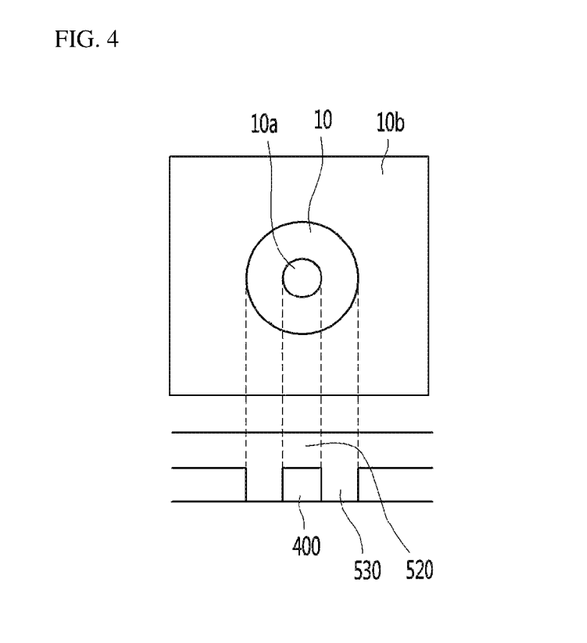
FIG. 4 is a cross-sectional view showing a state of a diffusion layer according to an image in an embodiment of the invention.
Figure 5A:
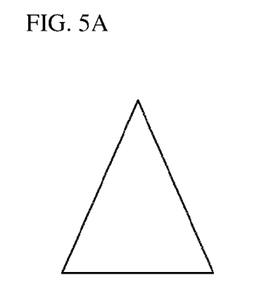
FIGS. 5A to 5D are views showing various aspects of a diffusion layer according to an embodiment of the invention.
Figure 5B:
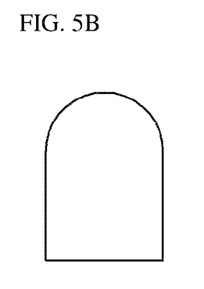
Figure 5C:
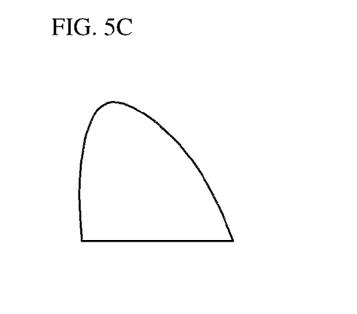
Figure 5D:
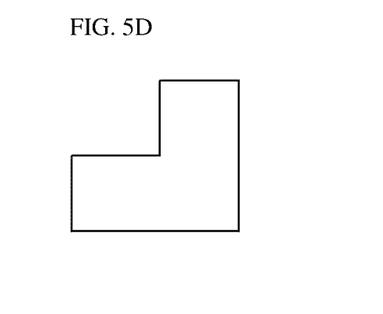

FIG. 1 is a schematic perspective view showing a lighting device according to a first embodiment, FIG. 2 is an A-A cross-section view of FIG. 1, FIG. 3 is an enlarged view showing a partial region of FIG. 2, FIG. 4 is a cross-sectional view showing a state of a diffusion layer according to an image, and FIG. 5 is a view showing various aspects of a diffusion layer.

Referring to FIG. 1, the lighting device 1000 according to the first embodiment may have a rectangular shape. The lighting device 1000 may be formed in a structure capable of multi-side light emission. For example, light may be emitted from four side surfaces and an upper surface of the lighting device 1000. Light may be emitted through the lower portion of the lighting device 1000. In the above, the lighting device 1000 is formed in a square shape, but is not limited thereto, and may be formed in various shapes such as polygonal or circular shape. In addition, the lighting device 1000 may be formed in a flat shape or a structure having one or more curved surfaces.

Referring to FIG. 2, the lighting device 1000 according to the first embodiment may include a substrate 100, a plurality of light sources 200 disposed on the substrate 100, a resin layer 300 on disposed on the light sources 200, a phosphor layer 500 disposed on the resin layer 300, and a plurality of diffusion layers 400 disposed between the resin layer 300 and the phosphor layer 500. The substrate 100 may include an insulating material or a conductive material. The substrate 100 may be formed of a rigid or flexible material. The substrate 100 may be formed of a transparent or opaque material. An electrode pad having a conductive pattern may be formed on one surface of the substrate 100.

As for the light source 200, N number of light sources 200 may be disposed in the direction of the long axis (column) of the substrate 100, and M number of light sources 200 may be disposed in the direction of the short axis (row) of the substrate 100. The N light sources 200 disposed in the long axis direction of the substrate 100 may be formed to have the same or different separation distances from each other. Likewise, the M light sources 200 disposed in the short axis direction of the substrate 100 may be formed to have the same or different separation distances. The separation distance between the light sources 200 may be appropriately designed to effectively implement a surface light source. The light source 200 may include an LED chip, for example, may be disposed on the substrate 100 as a flip-type LED chip.

The light source 200 may include a light emitting device. The light source 200 may emit blue, green, red, white, infrared or ultraviolet light. The light source 200 may emit blue light, for example, in a range of 420 nm to 470 nm. The light source 200 may be provided with a compound semiconductor. The light source 200 may be provided as a group II-VI or III-V compound semiconductor, for example. As an example, the light source 200 may be provided by including at least two or more elements selected from aluminum (Al), gallium (Ga), indium (In), phosphorus (P), arsenic (As), and nitrogen (N). The light source 200 may include a first conductivity type semiconductor layer, an active layer, and a second conductivity type semiconductor layer. The first and second conductivity type semiconductor layers may be implemented with at least one of a group III-V or a group II-VI compound semiconductor. The first and second conductivity type semiconductor layers may be formed of, for example, a semiconductor material having a composition formula of $In_xAl_yGa_{1-x-y}N$ ($0 \leq x \leq 1$, $0 \leq y \leq 1$, $0 \leq x+y \leq 1$). For example, the first and second conductivity type semiconductor layers may include at least one selected from the group including GaN, AlN, AlGaN, InGaN, InN, InAlGaN, AlInN, AlGaAs, GaP, GaAs, GaAsP, and AlGaInP, etc. The first conductivity type semiconductor layer may be an n-type semiconductor layer doped with an n-type dopant such as Si, Ge, Sn, Se, and Te. The second conductivity type semiconductor layer may be a p-type semiconductor layer doped with a p-type dopant such as Mg, Zn, Ca, Sr, and Ba. The active layer may be implemented with a compound semiconductor. The active layer may be implemented with at least one of a group III-V or a group II-VI compound semiconductor. When the active layer is implemented in a multi-well structure, the active layer may include a plurality of well layers and a plurality of barrier layers alternately disposed, and may disposed of a semiconductor material having a composition formula of $In_xAl_yGa_{1-x-y}N$ ($0 \leq x \leq 1$, $0 \leq y \leq 1$, $0 \leq x+y \leq 1$). For example, the active layer may include at least one selected from the group including InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, and InP/GaAs.

A reflective layer (not shown) may be further formed on the substrate 100. The reflective layer serves to guide the light generated by the light source 200 upward. The reflective layer may include a white material. The reflective layer may include a resin material. The reflective layer may include a resin such as silicone or epoxy. The reflective layer may include a reflective material such as $TiO_2$.

The resin layer 300 may be disposed on the substrate 100 and the light source 200. The resin layer 300 may be formed to cover the upper surface and side surfaces of the plurality of light sources 200. The resin layer 300 may be a transparent resin material, for example, a resin material such as UV (Ultra violet) resin, silicone, or epoxy. The UV resin may be, for example, a resin (oligomer type) containing a urethane acrylate oligomer as a main material. For example, it is possible to use a synthetic oligomer urethane acrylate oligomer. The main material may further include a monomer in which isobornyl acrylate (IBOA), hydroxybutyl acrylate (HBA), and hydroxy metaethyl acrylate (HEMA), which are low boiling point diluent type reactive monomers, are mixed, and as an additive, a photoinitiator (for example, 1-hydroxycyclohexyl phenyl-ketone, Diphenyl), Diphenyl (2,4,6-trimethylbenzoyl phosphine oxide), an antioxidant or the like may be mixed. The UV resin may be formed of a composition including 10 to 21% of an oligomer, 30 to 63% of a monomer, and 1.5 to 6% of an additive. In this case, the monomer may be a mixture of 10 to 21% of isobornyl acrylate (IBOA), 10 to 21% of hydroxybutyl acrylate (HBA), and 10 to 21% of hydroxy metaethyl acrylate (HEMA). The additive may be added in an amount of 1 to 5% of a photo initiator to be able to perform a function of initiating photo reactivity, and may be formed of a mixture capable of improving yellowing by adding 0.5 to 1% of an antioxidant. The formation of the resin layer using the above-described composition may form a layer with a resin such as UV resin instead of a light guide plate to adjust the refractive index and the thickness, and simultaneously, may satisfy all of adhesive characteristics, reliability and a mass production rate by using the above-described composition.

The resin layer 300 may further include a beads or diffusion agent therein. The diffusion agent may have a spherical shape, and its size may range from 4 μm to 6 μm. The shape and size of the diffusion agent are not limited thereto. In the above, the resin layer 300 is formed as one layer, but the invention is not limited thereto, and the resin layer 300 may include two or more layers. The resin layer 300 may include a first resin layer containing no impurities, and a second resin layer including a diffusion agent on the first resin layer. Alternatively, a second resin layer may be formed under the first resin layer.

The phosphor layer 500 may be formed on the resin layer 300. The phosphor layer 500 may be disposed to cover the upper and side surfaces of the resin layer 300. The phosphor layer 500 may include a transparent material. The phosphor layer 500 may include a transparent insulating material. The phosphor layer 500 may be made of silicon, and may be made of silicon having different chemical bonds. Silicon is a polymer in which silicon as an inorganic substance and carbon as an organic substance are combined, and has physical properties such as thermal stability, chemical stability, abrasion resistance, and glossiness of inorganic substances and reactivity, solubility, elasticity, and processability, which are characteristics of organic substances. Silicone may include general silicone, and fluorine silicone with an increased fluorine ratio. Increasing the fluorine ratio of fluorine silicone has an effect of improving moisture-proof properties.

The phosphor layer 500 may include a wavelength conversion means for receiving light emitted from the light source 200 and providing wavelength-converted light. For example, the phosphor layer 500 may include at least one selected from a group including phosphors, quantum dots, and the like. The phosphor or quantum dot may emit blue, green, or red light. The phosphor may be evenly disposed inside the phosphor layer 500. The phosphor may include a phosphor of a fluoride compound, and may include, for example, at least one of an MGF-based phosphor, a KSF-based phosphor, or a KTF-based phosphor. The phosphor may emit light with different peak wavelengths, and may emit light emitted from the light source 200 with different yellow and red or different red peak wavelengths.

When the phosphor is a red phosphor, the red phosphor may have a wavelength range of 610 nm to 650 nm, and the wavelength may have a width of less than 10 nm. The red phosphor may include a fluorite-based phosphor. The fluorite-based phosphor may include at least one of KSF-based red $K_2SiF_6:Mn_{4+}$, $K_2TiF_6:Mn_{4+}$, $NaYF_4:Mn_{4+}$, $NaGdF_4:Mn_{4+}$, $K_3SiF_7:Mn_{4+}$. The KSF-based phosphor may have, for example, a composition formula of $K_aSi_{1-c}F_b:Mn^{4+}{}_c$, wherein the a may satisfy $1 \leq a \leq 2.5$, the b may satisfy $5 \leq b \leq 6.5$, and the c may satisfy $0.001 \leq c \leq 0.1$. In addition, the fluoride-based red phosphor may be coated with a fluoride containing no Mn, or an organic material coating may be further included on the surface of the phosphor or the surface of the fluoride coating containing no Mn in order to improve reliability at high temperature/high humidity. In the case of the fluoride-based red phosphor as described above, unlike other phosphors, since a width of 10 nm or less may be realized, it may be used in a high-resolution device.

The phosphor composition according to the embodiment should basically conform to stoichiometry, and each element may be substituted with another element in each group on the periodic table. For example, Sr may be substituted with Ba, Ca, Mg, etc. of the alkaline earth II group, and Y may be substituted with Tb, Lu, Sc, Gd of the lanthanum series. In addition, Eu or the like as an activator may be substituted with Ce, Tb, Pr, Er, Yb, etc. according to a desired energy level, and a sub-activator or the like may be additionally applied to the activator alone or to modify properties. The quantum dots may include a compound semiconductor of group II-VI or a group III-V, and may emit red light. The quantum dots may be, for example, ZnS, ZnSe, ZnTe, CdS, CdSe, CdTe, GaN, GaP, GaAs, GaSb, InP, InAs, In, Sb, AlS, AlP, AlAs, PbS, PbSe, Ge, Si, $CuInS_2$, $CuInSe_2$ and the like, and combinations thereof.

The phosphor layer 500 may include red ink therein. In the red ink, when the light source 200 is not turned on, the outer surface of the lighting device 1000 may be viewed in red. That is, when the light is turned on or not, the lighting device 1000 is all displayed in red, thereby preventing a sense of heterogeneity due to color difference. The red ink may include red powder or red ink particles.

A pattern layer 510 including concave portions 511 and convex portions 512 may be included on a lower surface of the phosphor layer 500. The pattern layer 510 may be configured to have different heights of the phosphor layer 500 to implement an image or text on the outside. When the pattern layer 510 is formed on the upper surface of the phosphor layer 500, the pattern layer 510 may be exposed to the outside to reduce the aesthetics. Therefore, it is effective that the pattern layer 510 is formed on the lower surface of the phosphor layer 500.

The phosphor layer 500 may include a first phosphor layer 520 and a second phosphor layer 530. The first phosphor layer 520 may refer to a region in which the concave portion 511 is formed. The concave portion 511 may be a groove formed in the inner direction of the lower surface of the phosphor layer 500. The second phosphor layer 530 may refer to a region in which the convex portion 512 is formed. The second phosphor layer 530 may have a lower surface in contact with the upper surface of the resin layer 300.

A height of the first phosphor layer 520 may be smaller than a height of the second phosphor layer 530. The content of the phosphor contained in the first phosphor layer 520 may be smaller than the content of the phosphor included in the second phosphor layer 530.

When viewed from the outside, the light emitted from the second phosphor layer 530 due to the difference in the concentration of the phosphor between the first phosphor layer 520 and the second phosphor layer 530 may be seen darker than light emitted from the first phosphor layer 520. An image or text may be implemented by a difference in concentration of the phosphor between the first phosphor layer 520 and the second phosphor layer 530.

The diffusion layer 400 may be disposed between the resin layer 300 and the phosphor layer 500. The diffusion layer 400 may include a plurality of patterns. The diffusion layer 400 may be spaced apart from each other in the horizontal direction of the resin layer 300. The diffusion layer 400 may have a plurality of patterns formed in a row direction, and a plurality of patterns may be formed in a column direction. The diffusion layer 400 may improve the intensity of light emitted from the light source 200. The diffusion layer 400 may include a resin material. The diffusion layer 400 may include a polycarbonate resin, a polystyrene resin, a polyolefin resin, or a fluorine resin. The diffusion layer 400 may include a diffusion agent (not shown) therein. The diffusion agent may include inorganic and organic materials. The inorganic diffusion agent may include calcium carbonate, barium sulfate, titanium oxide, aluminum hydroxide, silica, glass, talc, mica, white carbon, magnesium oxide, zinc oxide, and the like. The organic-based diffusing agent may include styrene polymer particles, acrylic polymer particles, siloxane polymer particles, and the like. The diffusion agent may have a spherical shape, and its size may range from 4 μm to 6 μm. The shape and size of the diffusion agent are not limited thereto.

As shown in FIG. 3, the diffusion layer 400 may be disposed under the first phosphor layer 520. The diffusion layer 400 may be disposed in a region of the concave portion 511 of the pattern layer 510. The diffusion layer 400 may contact a lower surface of the first phosphor layer 520 and a side surface of the second phosphor layer 530. The height h3 of the second phosphor layer 530 may correspond to the sum of the height h2 of the first phosphor layer 520 and the height h1 of the diffusion layer 400. The thickness of the diffusion layer 400 may include 10% or more and less than 50% of the thickness of the second phosphor layer 530. The thickness of the diffusion layer 400 may include, for example, a range of 10% to 20% of the thickness of the second phosphor layer 530. When the height h3 of the second phosphor layer 530 is about 5 mm, the height h1 of the diffusion layer 400 may be less than 2.5 mm. When the height h1 or thickness of the diffusion layer 400 exceeds 50% of the height h3 or the maximum thickness of the second phosphor layer 530, the diffusion layer 400 may be visually recognized to the outside. Accordingly, the thickness of the diffusion layer 400 may be formed to be less than 50% of the height h3 or the maximum thickness of the second phosphor layer 530. In addition, when the thickness of the diffusion layer 400 is less than 10% of the height h3 of the second phosphor layer 530, there is no diffusion effect.

As shown in FIG. 4, when the lighting (turned on) image 10 has an 'O' shape, a first phosphor layer 520 and a diffusion layer 400 may be disposed in a region corresponding to the central region 10a of the image. In addition, a second phosphor layer 530 may be disposed in a region corresponding to the region 10 of the image. Since the phosphor concentration of the second phosphor layer 530 is higher than the phosphor concentration of the first phosphor layer 520, the color of the image region is displayed more darkly. In addition, the first phosphor layer 520 and the diffusion layer 400 may be disposed in the outer region 10b of the image in the same manner as the central region 10a of the image to display a lighter color than the image region 10. Here, when the height of the diffusion layer 400 disposed in the image outer region 10b is higher than the height of the diffusion layer 400 in the image center region 10a, the concentration of the first phosphor layer 520 in the image outer region 10b is smaller than the concentration of the first phosphor layer 520 of the image center region 10a, so that the color of the outer region 10b of the image may be displayed more lightly. The definition of the lighting image is a shape that is shown when turned on and may be a shape of a pattern layer. Alternatively, the shape of the lighting image may be a shape of a pattern layer disposed under the phosphor layer.

A cross-section of the diffusion layer 400 may have a square shape. The shape of the diffusion layer 400 is not limited thereto. As shown in FIG. 5, the cross-section of the diffusion layer 400 may include a triangular shape, a hemispherical shape, a shape in which one side is inclined, or a step shape. When the shape of the diffusion layer 400 is changed, the height of the first phosphor layer 520 corresponding thereto may be changed. Since the concentrations of the first phosphor layer 520 are different according to the height of the first phosphor layer 520, the contrast of the image displayed to the outside may be different from each other. Since the height of the diffusion layer 400 changes according to the height of the first phosphor layer 520, the diffusion effect may be further improved. The lighting device of the first embodiment has an effect of preventing non-diffusion of light in the phosphor layer having a low concentration by forming a diffusion layer under the phosphor layer.

Figure 6:
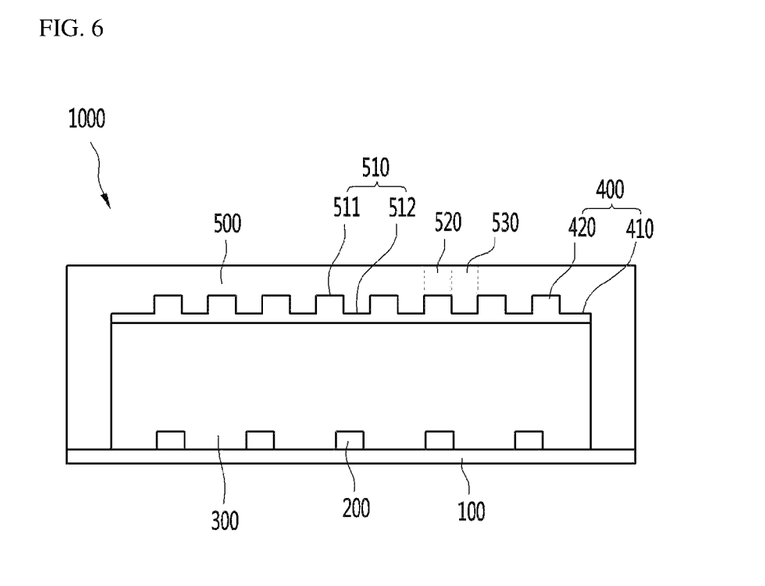
FIG. 6 is a cross-sectional view showing a lighting device according to a second embodiment.
Figure 7:
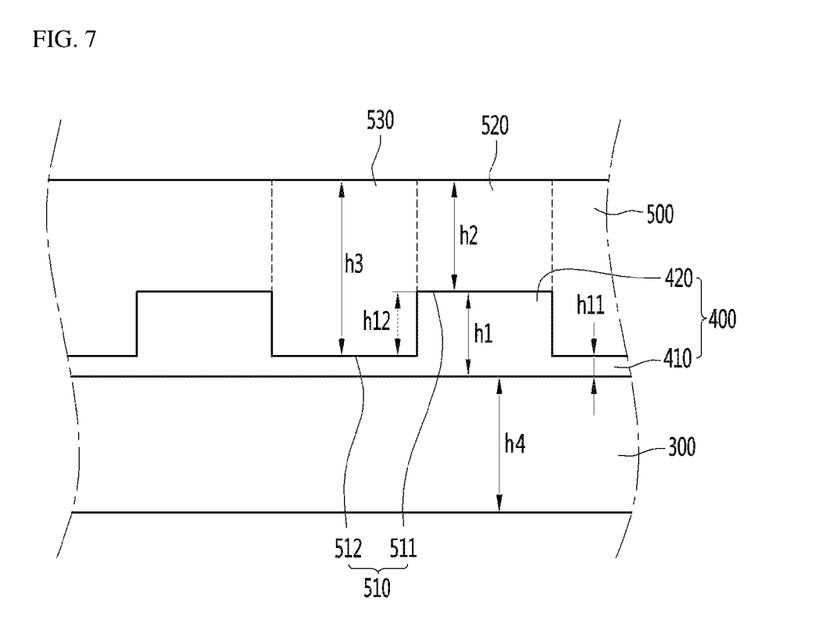
FIG. 7 is an enlarged view showing a partial region of FIG. 6.
Figure 8:
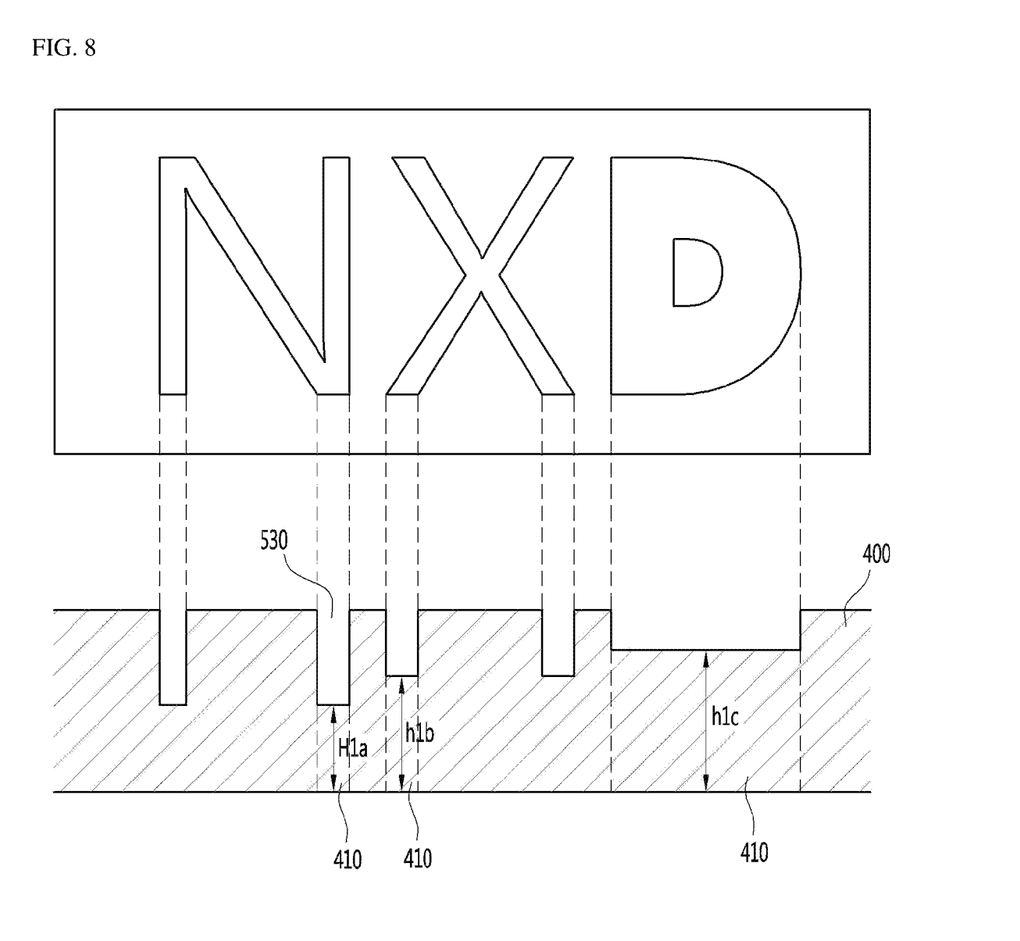
Figure 9:
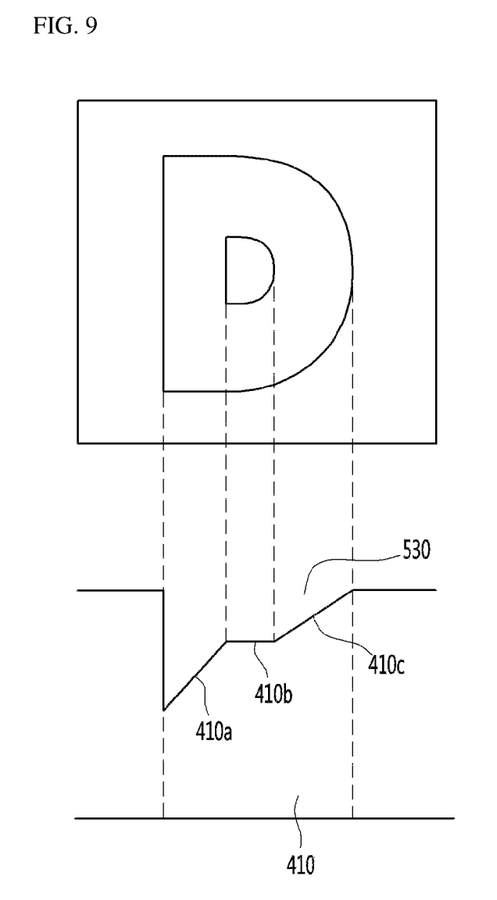

FIG. 6 is a cross-sectional view showing a lighting device according to a second embodiment, FIG. 7 is an enlarged view showing a partial region of FIG. 6, and FIGS. 8 and 9 are views showing a state in which an image is turned on.

As shown in FIG. 6, the lighting device 1000 according to the second embodiment may include a substrate 100, a plurality of light sources 200 disposed on the substrate 100, a resin layer 300 disposed on the light sources 200, a phosphor layer 500 disposed on the resin layer 300, and a plurality of diffusion layer 400 disposed between the resin layer 300 and the phosphor layer 500. Here, the configuration except for the diffusion layer 400 is the same as the configuration of the lighting device of the first embodiment, so a description thereof will be omitted.

The diffusion layer 400 may include a first diffusion layer 410 and a second diffusion layer 420 disposed on the first diffusion layer 410. The first diffusion layer 410 may be formed on an entire upper surface of the resin layer 300. The first diffusion layer 410 may contact the entire upper surface of the resin layer 300. The second diffusion layer 420 may be disposed on the first diffusion layer 410. The second diffusion layer 420 may include a plurality of patterns. The second diffusion layers 420 may be disposed to be spaced apart from each other in the horizontal direction from the first diffusion layer 410. The second diffusion layer 420 may be disposed in the concave portion 511 of the pattern layer 510 of the phosphor layer 500. The second diffusion layer 420 may contact a lower surface of the first phosphor layer 520 and a side surface of the second phosphor layer 530.

As shown in FIG. 7, the height h2 of the first phosphor layer 520, the height h11 of the first diffusion layer 410, and the height h12 of the second diffusion layer 420 may correspond to the height h3 of the second phosphor layer and 530 the height h11 of the first diffusion layer 410. The height h11 of the first diffusion layer 410 may be smaller than the height h12 of the second diffusion layer 420. The height h11 of the first diffusion layer 410 may be formed to be less than 30% of the height h4 of the resin layer 300. When the height h11 of the first diffusion layer 410 exceeds 30% of the height h4 of the resin layer 300, there is no diffusion effect and the total thickness of the lighting device becomes thick.

The height h12 of the thickness of the second diffusion layer 420 may include 10% or more and less than 50% of the height h3 of the maximum thickness of the second phosphor layer 530. More preferably 10% to 20% may be included. When the height h12 of the second diffusion layer 420 exceeds 50% of the height h3 of the second phosphor layer 530, the diffusion layer 400 may be visually recognized to the outside. Accordingly, the second diffusion layer 420 may be formed to have the height h3 of the second phosphor layer 530 or less than 50% of the maximum thickness. In addition, when the second diffusion layer 420 is less than 10% of the height of the second phosphor layer 530, there is no diffusion effect.

As shown in FIG. 8, the first diffusion layer 410 may have different heights. For example, when the lighted image has a shape of 'N', 'X', and 'D', the height h1a of the first diffusion layer 410 corresponding to the shape of the lighted image 'N', the height h1b of the first diffusion layer 410 corresponding to the shape of the lighted image 'X' and the height h1c of the first diffusion layer 410 corresponding to the shape of the lighted image 'D' may be formed differently from each other. The shape of such a lighted image may be a character, or may be various symbols or character shapes.

The height h1a of the first diffusion layer 410 corresponding to the shape of the lighted image 'N' may be formed to be smaller than the height h1b of the first diffusion layer 410 corresponding to the shape of the lighted image "X". In this case, since the height of the second phosphor layer 530 corresponding to the shape of the lighted image 'N' is higher than the height of the second phosphor layer 530 corresponding to the shape of the lighted image 'X', a difference in the contrast of the lighted images 'N' and 'X' may occur. Similarly, the height h1c of the first diffusion layer 410 corresponding to the lighted image 'D' shape may be formed different from the heights h1a and h1b of the first diffusion layer 410 of the lighted image 'N' and 'X' shapes. That is, according to the height of the first diffusion layer 410, a difference in contrast between the lighted images may be generated. Here, it may be formed in inverse proportion to the depth of the concave portion based on the line width of the lighted image. That is, the depth of the concave portion of an image having a relatively large line width among the lighted images may be reduced, and the depth of the concave portion of the image having a relatively small line width may be increased. In addition, the depths of the concave portions of one lighted image are the same, but the depth of the concave portions of the lighted images may be formed to gradually increase or decrease as the light goes in one direction.

As shown in FIG. 9, the upper surface of the first diffusion layer 410 may have two inclined surfaces 410a and 410c and one horizontal surface 410b. In this case, the lighted image 'D' shape may give a 3D effect by making the color thinner from left to right. The upper surface of the first diffusion layer 410 may include a plurality of inclined surfaces 410a and 410c having different heights and a horizontal surface 410b disposed between the plurality of inclined surfaces 410a and 410c. The height of the plurality of inclined surfaces 410a and 410c of the first diffusion layer 410 may increase or decrease from one side to the other side.

The concave portions of the first diffusion layer 410 may be referred to as first and second edges at both ends or opposite edges of the lighted image, and the depth of the concave portions adjacent to the first edge may be disposed deeper than the depth of the concave portions adjacent to the second edge. The depth of the concave portion adjacent to the first edge may gradually decrease toward the concave portion adjacent to the second edge. Here, the gradually decreasing depth may include a maximum depth, a minimum depth, and a section having the same depth. The depth of the concave portion adjacent to the second edge may be a boundary portion with the upper surface of the first diffusion layer 410. Conversely, the depth of the concave portion may be formed to be deepest at the second edge and gradually decrease in the direction of the first edge. In the first diffusion layer 410, the concave portion having an inclined surface may be gradually lowered for one lit image. Alternatively, the concave portion having the inclined surface in the first diffusion layer 410 may be gradually lowered or gradually deepened based on both ends or both edges of the plurality of lighted images. In one image or all of the images, the depth of the concave portion in the center direction may become deeper or, conversely, the depth of the concave portion in the center direction may decrease. Alternatively, in one image or all of the images, the depth of the concave portion may vary from one side to the other side or from the other side to one side. The lighting device of the second embodiment has an effect of effectively controlling the contrast of each lighted image by forming the diffusion layer 400 into two layers.

Figure 10:
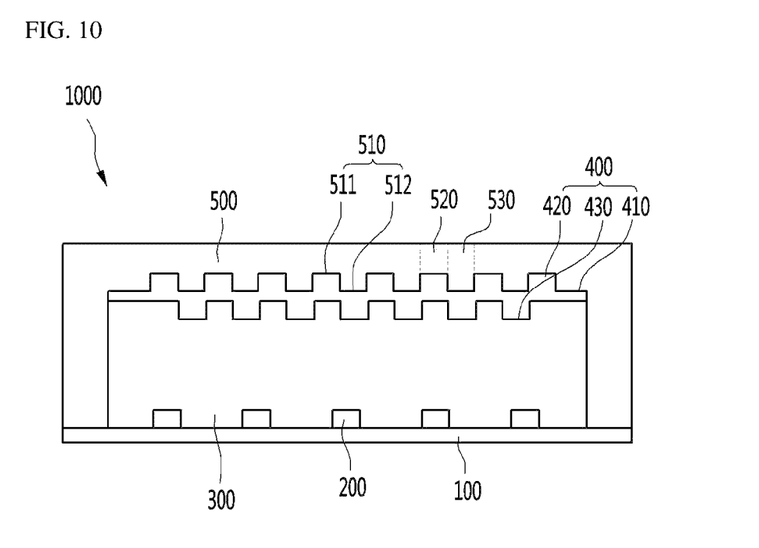
FIG. 10 is a cross-sectional view showing a lighting device according to a third embodiment.
Figure 11:
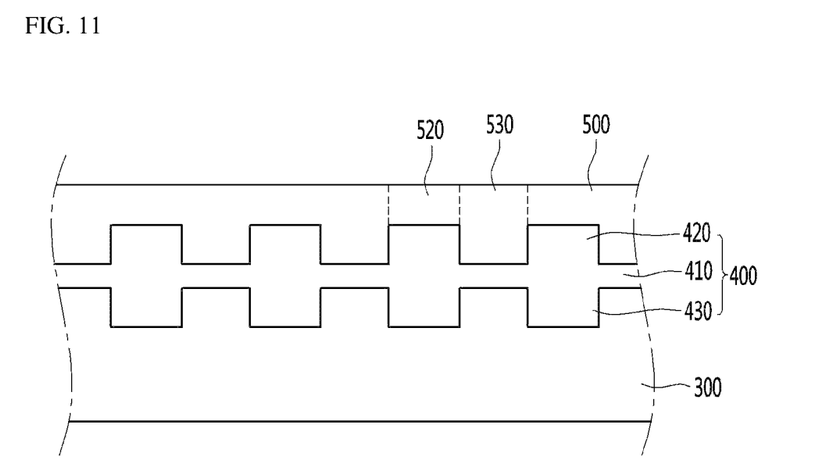
FIG. 11 is a cross-sectional view showing a modified example of the lighting device according to the third embodiment.

FIG. 10 is a cross-sectional view showing a lighting device according to the third embodiment, and FIG. 11 is a cross-sectional view showing a modified example of the lighting device according to the third embodiment.

As shown in FIG. 10, the lighting device 1000 according to the third embodiment may include a substrate 100, a plurality of light sources 200 disposed on the substrate 100, and a resin layer 300 disposed on the light source 200, a phosphor layer 500 disposed on the resin layer 300, and a plurality of diffusion layers 400 disposed between the resin layer 300 and the phosphor layer 500. Here, the configuration except for the diffusion layer 400 is the same as the configuration of the lighting device of the first embodiment, so a description thereof will be omitted. The diffusion layer 400 may include a first diffusion layer 410, a second diffusion layer 420 disposed on the first diffusion layer 410, and a third diffusion layer 430 disposed under the first diffusion layer 410. The first diffusion layer 410 may be formed on the entire upper surface of the resin layer 300. The first diffusion layer 410 may contact the entire upper surface of the resin layer 300. The second diffusion layer 420 may be disposed on the first diffusion layer 410. The second diffusion layer 420 may include a plurality of patterns. The plurality of second diffusion layers 420 may be spaced apart from each other in the horizontal direction from the first diffusion layer 410. The second diffusion layer 420 may be disposed in the concave portion 511 of the pattern layer 510 of the phosphor layer 500. The second diffusion layer 420 may contact a lower surface of the first phosphor layer 520 and a side surface of the second phosphor layer 530. Each of the plurality of second diffusion layers 420 may be a first protrusion protruding toward an upper surface of the phosphor layer 500. The diffusion layer 400 may have a thickness of a region in which the second diffusion layer 420 is disposed than that of the first diffusion layer 410.

The third diffusion layer 430 may be disposed under the first diffusion layer 410. The third diffusion layer 430 may include a plurality of pattern layers. The plurality of third diffusion layers 430 may be disposed to be spaced apart from each other in the horizontal direction from the first diffusion layer 410. The third diffusion layer 430 may be disposed to overlap the second phosphor layer 530 in a vertical direction. The shape of the third diffusion layer 430 may correspond to the shape of the second diffusion layer 420. The shapes of the second diffusion layer 420 and the third diffusion layer 430 may be formed in the shape of the diffusion layer according to the lighting device of the first embodiment. Each of the plurality of third diffusion layers 430 may be a second protrusion protruding toward a lower surface of the resin layer 300. The diffusion layer 400 may have a thickness greater than that of the first diffusion layer 410 in a region in which the third diffusion layer 430 is disposed. At least one of the second and third diffusion layers 420 and 430 may overlap in a vertical direction, or the other may not overlap. At least one of the second and third diffusion layers 420 and 430 may be formed identical to each other, or the other may have different shapes.

Since the height of the diffusion layer 400 disposed under the first phosphor layer 520 and the height of the diffusion layer 400 disposed under the second phosphor layer 530 are the same, there is an effect of solving the problem that light is not diffused by the second phosphor layer 520 and improving the luminous intensity in the entire region of the lighted image.

As shown in FIG. 11, the third diffusion layer 430 may be formed in a region corresponding to the second diffusion layer 420. The third diffusion layer 430 may be formed to overlap the second diffusion layer 420 in a vertical direction. The third diffusion layer 430 may correspond to the shape of the second diffusion layer 420.

In the lighting device of the embodiment, by adjusting the height of the diffusion layer 400 disposed under the first phosphor layer 520, the thickness of the lighting device 100 is not increased and the diffusion effect can be further improved.

An object of the invention is to provide a lighting device for effectively implementing a certain pattern while improving light efficiency.

A lighting device according to an embodiment of the invention includes a substrate, a plurality of light sources disposed on the substrate in a predetermined interval, a resin layer disposed on the substrate, and a phosphor layer disposed on the resin layer and having a pattern layer including concave portions and convex portions on a surface facing the resin layer, and a diffusion layer disposed between the resin layer and the phosphor layer, and the diffusion layer may have a thickness of 10% or more and less than 50% of a thickness of the phosphor layer.

According to an embodiment of the invention, the diffusion layer may include a plurality of patterns spaced apart from each other in a horizontal direction of the substrate on the resin layer, and the phosphor layer may contact the resin layer and the diffusion layer. The diffusion layer may include a first diffusion layer disposed on an entire surface of the resin layer, and a plurality of second diffusion layers disposed on the first diffusion layer in a horizontal direction spaced apart from the first diffusion layer, and the second diffusion layer may be disposed in the concave portion of the pattern layer. A height of the first diffusion layer may be less than 30% of the height of the resin layer. The diffusion layer may include a plurality of third diffusion layers spaced apart from each other in the horizontal direction from the first diffusion layer and disposed under the first diffusion layer. The third diffusion layers may be disposed in a lower region of the first diffusion layer at a position corresponding to the second diffusion layer. The third diffusion layers may be disposed not to vertically overlap the second diffusion layer. An upper surface of the first diffusion layer may have a plurality of inclined surfaces having different heights and a horizontal surface disposed between the plurality of inclined surfaces. A height of the plurality of inclined surfaces of the first diffusion layer may increase from one side toward the other side. A cross section of the first diffusion layer may have a polygonal shape, a hemispherical shape, a stepped shape, or an inclined surface. Heights of the plurality of third diffusion layers may have different heights.

According to an embodiment of the invention, the phosphor layer includes a first phosphor layer in a region in which the concave portions of the pattern layer are formed, and a second phosphor layer in a region in which the first phosphor layer may include a second phosphor layer in a region having a different phosphor content and formed in the convex portion of the pattern layer.

According to an embodiment of the invention, since a diffusion layer is disposed under the phosphor layer, there is an effect of preventing light from being diffused into the phosphor layer having a low concentration. In the embodiment, since the pattern layer is disposed on the lower surface of the phosphor layer, there is an effect of preventing the pattern layer from being exposed to the outside and deteriorating the aesthetics. In the embodiment, since the thickness of the diffusion layer is disposed less than 50% of the thickness of the phosphor layer, there is an effect of preventing the diffusion layer from being exposed to the outside.

The embodiment has an effect of implementing a lighting image having a 3D pattern effect by changing the shape of the diffusion layer to have multiple angles, steps, and slopes. According to the embodiment, the diffusion layer is formed in a plurality of layers, there is an effect that may effectively control the contrast of each lighting image. In the embodiment, since the height of the diffusion layer disposed under the first phosphor layer and the height of the diffusion layer disposed under the second phosphor layer are the same, there has an effect that the luminance on an entire region of the lighting image may be improved and may solve the problem that light is not diffused by the second phosphor layer. In addition, in the embodiment, since the height of the diffusion layer disposed under the first phosphor layer is adjusted, there is an effect that the diffusion effect may be further improved without increasing the thickness of the lighting device.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A lighting device comprising:
   a substrate;
   a plurality of light sources spaced apart from each other on the substrate;
   a resin layer disposed on the substrate and configured to seal the plurality of light sources;
   a diffusion layer disposed on a surface of the resin layer; and
   a phosphor layer disposed on the surface of the resin layer;
   wherein the diffusion layer includes a first concave portion having a first depth from an upper surface of the diffusion layer, and a second concave portion having a second depth from the upper surface of the diffusion layer,
   wherein the first depth is different than the second depth,
   wherein the first and second concave portions are spaced apart from each other in a first direction, and
   wherein a width in the first direction of the first concave portion is different than a width in the first direction of the second concave portion.

2. The lighting device of claim 1, wherein the diffusion layer includes a third concave portion having a third depth from the upper surface of the diffusion layer,
   wherein the third concave portion is spaced apart from the first or second concave portion, and
   wherein a width in the first direction of the third concave portion is different than the width of the first or second concave portions.

3. The lighting device of claim 1, wherein a maximum width of the first concave portion is different than a maximum width of the second concave portion.

4. The lighting device of claim 1, wherein a maximum depth of the first depth of the first concave portion is different than a maximum depth of the second depth of the second concave portion.

5. The lighting device of claim 1, wherein a maximum width of the first concave portion is different than a maximum width of the second concave portion, wherein the first depth is a maximum depth of the first concave portion, and wherein the second depth is a maximum depth of the second concave portion.

6. The lighting device of claim 1, wherein the diffusion layer is disposed between an upper surface of the resin layer and the phosphor layer.

7. The lighting device of claim 1, wherein a maximum thickness of the diffusion layer is less than 50% of a maximum thickness of the phosphor layer, and wherein a bottom surface of at least one of the first and second concave portions has a slope.

8. The lighting device of claim 1, wherein a maximum thickness of the diffusion layer is 10% or more and less than 50% of a maximum thickness of the phosphor layer, and wherein an area of the upper surface of the diffusion layer having the maximum thickness is larger than an area of a bottom surface of the first and second concave portions.

9. The lighting device of claim 1, wherein a thickness of the diffusion layer on the first concave portion is less than 30% of a thickness of the resin layer.

10. The lighting device of claim 1, wherein an external shape of each of the first and second concave portions corresponds to a symbol or a character having a line width.

* * * * *